United States Patent
Huemoeller et al.

(10) Patent No.: US 10,461,006 B1
(45) Date of Patent: Oct. 29, 2019

(54) ENCAPSULATED SEMICONDUCTOR PACKAGE

(71) Applicant: Amkor Technology, Inc., Chandler, AZ (US)

(72) Inventors: Ronald Patrick Huemoeller, Gilbert, AZ (US); Sukianto Rusli, Phoenix, AZ (US); David Jon Hiner, Chandler, AZ (US)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 14/581,305

(22) Filed: Dec. 23, 2014

Related U.S. Application Data

(60) Continuation of application No. 13/679,627, filed on Nov. 16, 2012, now Pat. No. 9,691,635, which is a
(Continued)

(51) Int. Cl.
*H05K 7/00* (2006.01)
*H01L 23/31* (2006.01)
(Continued)

(52) U.S. Cl.
CPC ........ *H01L 23/3107* (2013.01); *H01L 23/481* (2013.01); *H01L 23/50* (2013.01); *H01L 24/14* (2013.01)

(58) Field of Classification Search
CPC . H01L 2224/48465; H01L 2224/48091; H01L 2224/48227; H01L 2924/00;
(Continued)

(56) References Cited

U.S. PATENT DOCUMENTS 3,324,014 A 6/1967 Modjeska
3,778,900 A 12/1973 Haining et al.
(Continued)

FOREIGN PATENT DOCUMENTS

JP 05-109975 4/1993
JP 05-136323 6/1993
(Continued)

OTHER PUBLICATIONS

IBM Technical Disclosure Bulletin, "Microstructure Solder Mask by Means of a Laser", vol. 36, Issue 11, p. 589, Nov. 1, 1993.
(Continued)

*Primary Examiner* — Yuriy Semenenko
(74) *Attorney, Agent, or Firm* — McAndrews, Held & Malloy, Ltd.

(57) ABSTRACT

A method of manufacturing a semiconductor package includes mounting and electrically connecting a semiconductor die to a substrate. The semiconductor die and the substrate are encapsulated to form an encapsulation. Via holes are laser-ablated through the encapsulation and conductive material is deposited within the via holes to form vias. A first buildup dielectric layer is formed on the encapsulation. Laser-ablated artifacts are laser-ablated in the first buildup layer. The laser-ablated artifacts in the first buildup layer are filled with a first metal layer to form a first electrically conductive pattern in the first build up layer. The operations of forming a buildup layer, forming laser-ablated artifacts in the buildup layer, and filling the laser-ablated artifacts with an electrically conductive material to form an electrically conductive pattern can be performed any one of a number of times to achieve the desired redistribution.

20 Claims, 11 Drawing Sheets

Related U.S. Application Data continuation of application No. 12/387,691, filed on May 5, 2009, now Pat. No. 8,341,835, which is a division of application No. 11/497,617, filed on Aug. 1, 2006, now Pat. No. 7,548,430, which is a continuation-in-part of application No. 11/293,999, filed on Dec. 5, 2005, now Pat. No. 7,633,765, which is a continuation-in-part of application No. 10/806,640, filed on Mar. 23, 2004, now Pat. No. 7,185,426, which is a continuation-in-part of application No. 10/138,225, filed on May 1, 2002, now Pat. No. 6,930,256.

(51) Int. Cl.
 *H01L 23/48* (2006.01)
 *H01L 23/50* (2006.01)
 *H01L 23/00* (2006.01)

(58) Field of Classification Search
 CPC ............ H01L 2224/85; H01L 2224/92; H01L 2224/82; H01L 2224/83; H01L 2924/00014; H01L 21/4857; H01L 2224/16; H01L 2224/18
 See application file for complete search history.

(56) References Cited

U.S. PATENT DOCUMENTS

| | | |
|---|---|---|
| 3,868,724 A | 2/1975 | Perrino |
| 3,916,434 A | 10/1975 | Garboushian |
| 4,322,778 A | 3/1982 | Barbour et al. |
| 4,508,754 A | 4/1985 | Stepan |
| 4,532,152 A | 7/1985 | Elarde |
| 4,532,419 A | 7/1985 | Takeda |
| 4,604,799 A | 8/1986 | Gurol |
| 4,642,160 A | 2/1987 | Burqess |
| 4,645,552 A | 2/1987 | Vitriol et al. |
| 4,685,033 A | 8/1987 | Inoue |
| 4,706,167 A | 11/1987 | Sullivan |
| 4,716,049 A | 12/1987 | Patraw |
| 4,786,952 A | 11/1988 | Maciver et al. |
| 4,806,188 A | 2/1989 | Rellick |
| 4,811,082 A | 3/1989 | Jacobs et al. |
| 4,897,338 A | 1/1990 | Spicciati et al. |
| 4,905,124 A | 2/1990 | Banjo et al. |
| 4,915,983 A | 4/1990 | Lake et al. |
| 4,964,212 A | 10/1990 | Deroux-Dauphin et al. |
| 4,974,120 A | 11/1990 | Kodai et al. |
| 4,996,391 A | 2/1991 | Schmidt |
| 5,021,047 A | 6/1991 | Movern |
| 5,053,357 A | 10/1991 | Lin et al. |
| 5,072,075 A | 12/1991 | Lee et al. |
| 5,072,520 A | 12/1991 | Nelson |
| 5,081,520 A | 1/1992 | Yoshii et al. |
| 5,091,769 A | 2/1992 | Eichelberger |
| 5,108,553 A | 4/1992 | Foster et al. |
| 5,110,664 A | 5/1992 | Nakanishi et al. |
| 5,111,278 A | 5/1992 | Eichelberger |
| 5,191,174 A | 3/1993 | Chanq et al. |
| 5,229,550 A | 7/1993 | Bindra et al. |
| 5,239,448 A | 8/1993 | Perkins et al. |
| 5,247,429 A | 9/1993 | Iwase et al. |
| 5,250,843 A | 10/1993 | Eichelberger |
| 5,263,243 A | 11/1993 | Taneda et al. |
| 5,278,726 A | 1/1994 | Bernardoni et al. |
| 5,283,459 A | 2/1994 | Hirano et al. |
| 5,293,243 A | 3/1994 | Degnan et al. |
| 5,324,687 A | 6/1994 | Wojnarowski |
| 5,353,498 A | 10/1994 | Fillion et al. |
| 5,371,654 A | 12/1994 | Beaman et al. |
| 5,379,191 A | 1/1995 | Carey et al. |
| 5,404,044 A | 4/1995 | Booth et al. |
| 5,440,805 A | 8/1995 | Daigle et al. |
| 5,463,253 A | 10/1995 | Waki et al. |
| 5,474,957 A | 12/1995 | Urushima |
| 5,474,958 A | 12/1995 | Djennas et al. |
| 5,497,033 A | 3/1996 | Fillion et al. |
| 5,508,938 A | 4/1996 | Wheeler |
| 5,530,288 A | 6/1996 | Stone |
| 5,531,020 A | 7/1996 | Durand et al. |
| 5,546,654 A | 8/1996 | Wojnarowski et al. |
| 5,574,309 A | 11/1996 | Papapietro et al. |
| 5,581,498 A | 12/1996 | Ludwiq et al. |
| 5,582,858 A | 12/1996 | Adamopoulos et al. |
| 5,616,422 A | 4/1997 | Ballard et al. |
| 5,637,832 A | 6/1997 | Danner |
| 5,674,785 A | 10/1997 | Akram et al. |
| 5,719,749 A | 2/1998 | Stopperan |
| 5,726,493 A | 3/1998 | Yamashita et al. |
| 5,731,047 A | 3/1998 | Noddin |
| 5,739,579 A | 4/1998 | Chiang et al. |
| 5,739,581 A | 4/1998 | Chillara |
| 5,739,585 A | 4/1998 | Akram et al. |
| 5,739,588 A | 4/1998 | Ishida et al. |
| 5,742,479 A | 4/1998 | Asakura |
| 5,774,340 A | 6/1998 | Chanq et al. |
| 5,784,259 A | 7/1998 | Asakura |
| 5,798,014 A | 8/1998 | Weber |
| 5,822,190 A | 10/1998 | Iwasaki |
| 5,826,330 A | 10/1998 | Isoda et al. |
| 5,835,355 A | 11/1998 | Dordi |
| 5,841,075 A | 11/1998 | Hanson |
| 5,841,102 A | 11/1998 | Noddin |
| 5,847,327 A | 12/1998 | Fischer et al. |
| 5,847,453 A | 12/1998 | Uematsu et al. |
| 5,863,446 A | 1/1999 | Hanson |
| 5,868,950 A | 2/1999 | Noddin |
| 5,883,425 A * | 3/1999 | Kobayashi ............. H01L 21/50 257/678 |
| 5,893,724 A * | 4/1999 | Chakravorty ........... H01L 21/56 257/E21.502 |
| 5,894,108 A | 4/1999 | Mostafazadeh et al. |
| 5,898,219 A | 4/1999 | Barrow |
| 5,903,052 A | 5/1999 | Chen et al. |
| 5,907,477 A | 5/1999 | Tuttle et al. |
| 5,910,255 A | 6/1999 | Noddin |
| 5,919,329 A | 7/1999 | Banks et al. |
| 5,936,843 A | 8/1999 | Ohshima et al. |
| 5,952,611 A | 9/1999 | Enq et al. |
| 5,965,043 A | 10/1999 | Noddin et al. |
| 5,970,319 A | 10/1999 | Banks et al. |
| 5,981,314 A * | 11/1999 | Glenn .................... H01L 21/56 257/E21.502 |
| 5,990,546 A | 11/1999 | Igarashi et al. |
| 6,004,619 A | 12/1999 | Dippon et al. |
| 6,013,948 A | 1/2000 | Akram et al. |
| 6,015,722 A | 1/2000 | Banks et al. |
| 6,021,564 A | 2/2000 | Hanson |
| 6,023,041 A | 2/2000 | Noddin |
| 6,028,364 A | 2/2000 | Ogino et al. |
| 6,034,427 A | 3/2000 | Lan et al. |
| 6,035,527 A | 3/2000 | Tamm |
| 6,039,889 A | 3/2000 | Zhang et al. |
| 6,040,622 A | 3/2000 | Wallace |
| 6,060,778 A | 5/2000 | Jeong et al. |
| 6,064,116 A * | 5/2000 | Akram ................ H01L 23/3677 257/700 |
| 6,069,407 A | 5/2000 | Hamzehdoost |
| 6,072,243 A | 6/2000 | Nakanishi |
| 6,081,036 A | 6/2000 | Hirano et al. |
| 6,103,992 A | 8/2000 | Noddin |
| 6,115,910 A | 9/2000 | Ghahghahi |
| 6,119,338 A | 9/2000 | Wang et al. |
| 6,122,171 A | 9/2000 | Akram et al. |
| 6,127,250 A | 10/2000 | Sylvester et al. |
| 6,127,833 A | 10/2000 | Wu et al. |
| 6,132,853 A | 10/2000 | Noddin |
| 6,160,705 A | 12/2000 | Stearns et al. |
| 6,162,365 A | 12/2000 | Bhatt et al. |
| 6,172,419 B1 | 1/2001 | Kinsman |
| 6,175,087 B1 | 1/2001 | Keesler et al. |
| 6,184,463 B1 | 2/2001 | Panchou et al. |

(56) References Cited

U.S. PATENT DOCUMENTS

| | | |
|---|---|---|
| 6,194,250 B1 | 2/2001 | Melton et al. |
| 6,203,891 B1 | 3/2001 | Noddin |
| 6,204,453 B1 | 3/2001 | Fallon et al. |
| 6,211,485 B1 | 4/2001 | Burgess |
| 6,214,641 B1 | 4/2001 | Akram |
| 6,235,554 B1 | 5/2001 | Akram et al. |
| 6,239,485 B1 | 5/2001 | Peters et al. |
| D445,096 S | 7/2001 | Wallace |
| D446,525 S | 8/2001 | Okamoto et al. |
| 6,274,821 B1 | 8/2001 | Echiqo et al. |
| 6,280,641 B1 | 8/2001 | Gaku et al. |
| 6,316,285 B1 | 11/2001 | Jiang et al. |
| 6,351,031 B1 | 2/2002 | Iijima et al. |
| 6,352,914 B2 | 3/2002 | Ball et al. |
| 6,353,999 B1 | 3/2002 | Cheng |
| 6,365,975 B1 | 4/2002 | DiStefano et al. |
| 6,368,967 B1 | 4/2002 | Besser |
| 6,376,906 B1 | 4/2002 | Asai et al. |
| 6,378,201 B1 | 4/2002 | Tsukada et al. |
| 6,392,160 B1 | 5/2002 | Andry et al. |
| 6,395,578 B1 | 5/2002 | Shin et al. |
| 6,405,431 B1 * | 6/2002 | Shin .................... H05K 3/0038 205/126 |
| 6,406,942 B2 | 6/2002 | Honda |
| 6,407,341 B1 | 6/2002 | Anstrom et al. |
| 6,407,930 B1 | 6/2002 | Hsu |
| 6,418,615 B1 | 7/2002 | Rokugawa et al. |
| 6,426,550 B2 | 7/2002 | Ball et al. |
| 6,448,510 B1 | 9/2002 | Neftin et al. |
| 6,451,509 B2 | 9/2002 | Keesler et al. |
| 6,451,624 B1 | 9/2002 | Farnworth et al. |
| 6,472,306 B1 | 10/2002 | Lee et al. |
| 6,479,762 B2 | 11/2002 | Kusaka |
| 6,489,676 B2 | 12/2002 | Taniguchi et al. |
| 6,497,943 B1 | 12/2002 | Jimarez et al. |
| 6,501,165 B1 | 12/2002 | Farnworth et al. |
| 6,502,774 B1 | 1/2003 | Johansson et al. |
| 6,517,995 B1 | 2/2003 | Jacobson et al. |
| 6,528,874 B1 | 3/2003 | Iijima et al. |
| 6,534,391 B1 | 3/2003 | Huemoeller et al. |
| 6,534,723 B1 | 3/2003 | Asai et al. |
| 6,544,638 B2 | 4/2003 | Fischer et al. |
| 6,570,258 B2 | 5/2003 | Ma et al. |
| 6,574,106 B2 | 6/2003 | Mori |
| 6,586,682 B2 | 7/2003 | Strandberg |
| 6,590,165 B1 | 7/2003 | Takada et al. |
| 6,608,757 B1 | 8/2003 | Bhatt et al. |
| 6,614,104 B2 | 9/2003 | Farnworth et al. |
| 6,625,880 B2 | 9/2003 | Nabemoto et al. |
| 6,631,558 B2 | 10/2003 | Burgess |
| 6,637,105 B1 | 10/2003 | Watanabe et al. |
| 6,639,324 B1 | 10/2003 | Chien |
| 6,660,559 B1 | 12/2003 | Huemoeller et al. |
| 6,703,310 B2 | 3/2004 | Mashino et al. |
| 6,714,418 B2 | 3/2004 | Frankowsky et al. |
| 6,715,204 B1 | 4/2004 | Tsukada et al. |
| 6,727,645 B2 | 4/2004 | Tsuiimura et al. |
| 6,730,857 B2 | 5/2004 | Konrad et al. |
| 6,734,542 B2 | 5/2004 | Nakatani et al. |
| 6,740,964 B2 | 5/2004 | Sasaki |
| 6,753,612 B2 | 6/2004 | Adae-Amoakoh et al. |
| 6,774,748 B1 | 8/2004 | Ito et al. |
| 6,787,443 B1 | 9/2004 | Boggs et al. |
| 6,803,528 B1 | 10/2004 | KoyanaQi |
| 6,804,881 B1 | 10/2004 | Shipley et al. |
| 6,815,709 B2 | 11/2004 | Clothier et al. |
| 6,815,739 B2 | 11/2004 | Huff et al. |
| 6,822,334 B2 | 11/2004 | Hori et al. |
| 6,838,776 B2 | 1/2005 | Leal et al. |
| 6,847,109 B2 | 1/2005 | Shim |
| 6,888,240 B2 | 5/2005 | Towle et al. |
| 6,891,261 B2 | 5/2005 | Awaya |
| 6,908,863 B2 | 6/2005 | Barns et al. |
| 6,913,952 B2 | 7/2005 | Moxham et al. |
| 6,919,514 B2 | 7/2005 | Konrad et al. |
| 6,921,968 B2 | 7/2005 | Chunq |
| 6,921,975 B2 | 7/2005 | Leal et al. |
| 6,930,256 B1 | 8/2005 | Huemoeller et al. |
| 6,930,257 B1 | 8/2005 | Hiner et al. |
| 6,931,726 B2 | 8/2005 | Boyko et al. |
| 6,940,170 B2 | 9/2005 | Parikh |
| 6,946,325 B2 | 9/2005 | Yean et al. |
| 6,953,995 B2 | 10/2005 | Farnworth et al. |
| 6,963,141 B2 | 11/2005 | Lee et al. |
| 6,989,593 B2 | 1/2006 | Khan et al. |
| 6,998,335 B2 | 2/2006 | Fan et al. |
| 7,015,075 B2 | 3/2006 | Fay et al. |
| 7,018,866 B2 | 3/2006 | Sugaya et al. |
| 7,028,400 B1 | 4/2006 | Hiner et al. |
| 7,029,953 B2 | 4/2006 | Sasaki |
| 7,030,469 B2 | 4/2006 | Mahadevan et al. |
| 7,033,928 B2 | 4/2006 | Kawano |
| 7,057,290 B2 | 6/2006 | Sunohara et al. |
| 7,061,095 B2 | 6/2006 | Boggs et al. |
| 7,081,661 B2 | 7/2006 | Takehara et al. |
| 7,084,513 B2 | 8/2006 | Matsuki et al. |
| 7,087,514 B2 | 8/2006 | Shizuno |
| 7,095,623 B2 | 8/2006 | Suwa et al. |
| 7,125,744 B2 | 10/2006 | Takehara et al. |
| 7,145,238 B1 | 12/2006 | Huemoeller et al. |
| 7,185,426 B1 | 3/2007 | Hiner et al. |
| 7,189,593 B2 | 3/2007 | Lee |
| 7,198,980 B2 * | 4/2007 | Jiang .................... H01L 23/3128 257/E23.175 |
| 7,211,289 B2 | 5/2007 | Larnerd et al. |
| 7,214,609 B2 | 5/2007 | Jiang et al. |
| 7,242,081 B1 | 7/2007 | Lee |
| 7,276,799 B2 | 10/2007 | Lee et al. |
| 7,282,394 B2 | 10/2007 | Cho et al. |
| 7,282,804 B2 | 10/2007 | Lee |
| 7,285,855 B2 | 10/2007 | Foong |
| 7,285,862 B2 | 10/2007 | Sunohara et al. |
| 7,292,056 B2 | 11/2007 | Matsuda |
| 7,297,562 B1 | 11/2007 | Huemoeller et al. |
| 7,312,400 B2 | 12/2007 | Ito et al. |
| 7,335,972 B2 | 2/2008 | Chanchani |
| 7,345,361 B2 | 3/2008 | Mallik et al. |
| 7,348,677 B2 | 3/2008 | Larnerd et al. |
| 7,365,006 B1 | 4/2008 | Huemoeller et al. |
| 7,372,151 B1 | 5/2008 | Fan et al. |
| 7,399,661 B2 | 7/2008 | Huemoeller et al. |
| 7,420,809 B2 | 9/2008 | Lim et al. |
| 7,429,786 B2 | 9/2008 | Karnezos et al. |
| 7,435,352 B2 | 10/2008 | Mok et al. |
| 7,459,202 B2 | 12/2008 | Maqera et al. |
| 7,548,430 B1 | 6/2009 | Huemoeller et al. |
| 7,550,857 B1 | 6/2009 | Longo et al. |
| 7,552,531 B2 | 6/2009 | Takada et al. |
| 7,589,398 B1 | 9/2009 | Huemoeller et al. |
| 7,633,765 B1 | 12/2009 | Scanlan et al. |
| 7,670,962 B2 | 3/2010 | Huemoeller et al. |
| 7,671,457 B1 | 3/2010 | Hiner et al. |
| 7,752,752 B1 | 7/2010 | Rusli et al. |
| 7,777,351 B1 | 8/2010 | Berry et al. |
| 7,825,520 B1 | 11/2010 | Longo et al. |
| 7,830,000 B2 | 11/2010 | Eichelberger et al. |
| 7,859,085 B2 | 12/2010 | Pagaila et al. |
| 7,863,090 B2 | 1/2011 | Eichelberger et al. |
| 7,911,037 B1 | 3/2011 | Huemoeller et al. |
| 7,960,827 B1 | 6/2011 | Miller, Jr. et al. |
| 8,017,436 B1 | 9/2011 | Huemoeller et al. |
| 8,018,068 B1 | 9/2011 | Scanlan et al. |
| 8,026,587 B1 | 9/2011 | Hiner et al. |
| 8,110,909 B1 | 2/2012 | Hiner et al. |
| 8,203,203 B1 | 6/2012 | Scanlan |
| 8,227,338 B1 | 7/2012 | Scanlan et al. |
| 8,316,536 B1 | 11/2012 | Huemoeller et al. |
| 8,322,030 B1 | 12/2012 | Huemoeller et al. |
| 8,324,020 B2 | 12/2012 | Eichelberger et al. |
| 8,341,835 B1 | 1/2013 | Huemoeller et al. |
| 8,384,199 B2 | 2/2013 | Eichelberger et al. |
| 8,474,133 B2 | 7/2013 | Eichelberger et al. |
| 8,533,941 B2 | 9/2013 | Eichelberger et al. |
| 8,564,119 B2 | 10/2013 | Eichelberger et al. |

(56) References Cited

U.S. PATENT DOCUMENTS

| | | |
|---|---|---|
| 8,590,145 B2 | 11/2013 | Eichelberger et al. |
| 8,629,546 B1 | 1/2014 | Scanlan |
| 8,826,531 B1 | 9/2014 | Hiner et al. |
| 8,872,329 B1 | 10/2014 | Hiner et al. |
| 2001/0020548 A1 | 9/2001 | Burgess |
| 2001/0041436 A1 | 11/2001 | Parikhkk |
| 2002/0017710 A1* | 2/2002 | Kurashima ....... H01L 21/76898 |
| | | 257/686 |
| 2002/0017712 A1 | 2/2002 | Bessho et al. |
| 2002/0030245 A1 | 3/2002 | Hanaoka et al. |
| 2002/0031650 A1 | 3/2002 | Fischer et al. |
| 2002/0060361 A1* | 5/2002 | Sasaki ................. H01L 23/3128 |
| | | 257/698 |
| 2002/0061642 A1 | 5/2002 | Haji et al. |
| 2002/0066952 A1 | 6/2002 | Taniguchi et al. |
| 2002/0117764 A1 | 8/2002 | Huang |
| 2002/0140105 A1 | 10/2002 | Higgins, III et al. |
| 2002/0140108 A1* | 10/2002 | Johnson ................ H01L 21/563 |
| | | 257/778 |
| 2002/0195697 A1 | 12/2002 | Mess et al. |
| 2003/0000738 A1 | 1/2003 | Rumsey et al. |
| 2003/0025188 A1 | 2/2003 | Farnworth et al. |
| 2003/0025199 A1 | 2/2003 | Wu et al. |
| 2003/0029636 A1 | 2/2003 | Carpenter et al. |
| 2003/0112610 A1 | 6/2003 | Frankowsky et al. |
| 2003/0128096 A1* | 7/2003 | Mazzochette .......... H01C 7/008 |
| | | 338/22 R |
| 2003/0134450 A1 | 7/2003 | Lee |
| 2003/0141582 A1 | 7/2003 | Yang et al. |
| 2003/0150644 A1 | 8/2003 | Takada et al. |
| 2003/0168255 A1 | 9/2003 | Kim et al. |
| 2003/0197284 A1 | 10/2003 | Khianq et al. |
| 2003/0218871 A1 | 11/2003 | Suwa et al. |
| 2004/0058472 A1 | 3/2004 | Shim |
| 2004/0063246 A1 | 4/2004 | Karnezos |
| 2004/0110323 A1 | 6/2004 | Becker et al. |
| 2004/0113260 A1 | 6/2004 | Sunohara et al. |
| 2004/0145044 A1 | 7/2004 | Sugaya et al. |
| 2004/0159462 A1 | 8/2004 | Chunq |
| 2004/0178510 A1 | 9/2004 | Sunohara et al. |
| 2005/0046002 A1 | 3/2005 | Lee et al. |
| 2005/0136646 A1 | 6/2005 | Larnerd et al. |
| 2005/0139985 A1 | 6/2005 | Takahashi |
| 2005/0194353 A1 | 9/2005 | Johnson et al. |
| 2005/0205295 A1 | 9/2005 | Tsuk |
| 2005/0242425 A1 | 11/2005 | Leal et al. |
| 2006/0008944 A1 | 1/2006 | Shizuno |
| 2006/0091561 A1 | 5/2006 | Oangelmaier et al. |
| 2006/0121690 A1 | 6/2006 | Pogge et al. |
| 2006/0157854 A1 | 7/2006 | Takewaki et al. |
| 2006/0183316 A1 | 8/2006 | Larnerd et al. |
| 2006/0197228 A1 | 9/2006 | Daubenspeck et al. |
| 2006/0231950 A1 | 10/2006 | Yoon |
| 2006/0270108 A1 | 11/2006 | Farnworth et al. |
| 2007/0114203 A1 | 5/2007 | Kang |
| 2007/0158787 A1 | 7/2007 | Chanchani |
| 2007/0273049 A1 | 11/2007 | Khan et al. |
| 2007/0281471 A1 | 12/2007 | Hurwitz et al. |
| 2007/0290376 A1 | 12/2007 | Zhao et al. |
| 2008/0020512 A1* | 1/2008 | Karnezos ............ H01L 23/3128 |
| | | 438/110 |
| 2008/0043447 A1 | 2/2008 | Huemoeller et al. |
| 2008/0157250 A1 | 7/2008 | Yang et al. |
| 2008/0230887 A1 | 9/2008 | Sun et al. |

FOREIGN PATENT DOCUMENTS

| | | |
|---|---|---|
| JP | 07-017175 | 1/1995 |
| JP | 08-190615 | 7/1996 |
| JP | 10-334205 | 12/1998 |
| WO | WO 03/103042 | * 12/2003 |

OTHER PUBLICATIONS

Kim et al., "Application of Through Mold via (TMV) as PoP base package", 58th ECTC Proceedings, May 2008, Lake Buena Vista, FL, 6 pages, IEEE.

Scanlan, "Package-on-package (PoP) with Through-mold Vias", Advanced Packaging, Jan. 2008, 3 pages, vol. 17, Issue 1, PennWell Corporation.

Hiner et al., "Printed Wiring Motherboard Having Bonded Interconnect Redistribution Mesa", U.S. Appl. No. 10/992,371, filed Nov. 18, 2004.

Hiner et al., "Semiconductor Package Including Top-Surface Terminals for Mounting Another Semiconductor Package", U.S. Appl. No. 13/199,274, filed Aug. 23, 2011.

Hiner et al., "Semiconductor Package Including Top-Surface Terminals for Mounting Another Semiconductor Package", U.S. Appl. No. 13/918,679, filed Jun. 14, 2013.

Huemoeller et al., "Build Up Motherboard Fabrication Method and Structure", U.S. Appl. No. 11/824,395, filed Jun. 29, 2007.

Huemoeller et al., U.S. Appl. No. 11/045,402, filed Jan. 28, 2005, entitled "Method for Making a Semiconductor Package Substrate Having a Printed Circuit Pattern Atop and Within a Dielectric".

Huemoeller et al., U.S. Appl. No. 11/189,593, filed Jul. 26, 2005, entitled "Integral Plated Semiconductor Package Substrate Stiffener".

Scanlan et al., "Semiconductor Package Including a Top-Surface Metal Layer for Implementing Circuit Features", U.S. Appl. No. 12/802,715, filed Jun. 10, 2010.

Wolf et al., "Silicon Processing for the VLSI Era: vol. 1—Process Technology", 1986, pp. 407-408.

* cited by examiner

ENCAPSULATED SEMICONDUCTOR PACKAGE

CROSS-REFERENCE TO RELATED APPLICATIONS

This application is a continuation of U.S. patent application Ser. No. 13/679,627, filed Nov. 16, 2012, entitled "BUILDUP DIELECTRIC LAYER HAVING METALLIZATION PATTERN SEMICONDUCTOR PACKAGE FABRICATION METHOD", which is a continuation of Huemoeller et al., U.S. patent application Ser. No. 12/387,691, filed on May 5, 2009, entitled "BUILDUP DIELECTRIC LAYER HAVING METALLIZATION PATTERN SEMICONDUCTOR PACKAGE FABRICATION METHOD", now U.S. Pat. No. 8,341,835, issued Jan. 1, 2013, which is a divisional of Huemoeller et al., U.S. patent application Ser. No. 11/497,617, filed on Aug. 1, 2006, entitled "BUILDUP DIELECTRIC AND METALLIZATION PROCESS AND SEMICONDUCTOR PACKAGE", now U.S. Pat. No. 7,548,430, issued Jun. 16, 2009, which is a continuation-in-part of Scanlan et al, U.S. patent application Ser. No. 11/293,999, filed on Dec. 5, 2005, entitled "SEMICONDUCTOR PACKAGE INCLUDING A TOP-SURFACE METAL LAYER FOR IMPLEMENTING CIRCUIT FEATURES", now U.S. Pat. No. 7,633,765, issued Dec. 15, 2009, which is a continuation-in-part of Hiner et al., U.S. patent application Ser. No. 10/806,640, filed on Mar. 23, 2004, entitled "METHOD OF MANUFACTURING A SEMICONDUCTOR PACKAGE", now U.S. Pat. No. 7,185,426, issued Mar. 6, 2007, which is a continuation-in-part of Huemoeller, et al., U.S. patent application Ser. No. 10/138,225, filed on May 1, 2002, entitled "INTEGRATED CIRCUIT SUBSTRATE HAVING LASER-EMBEDDED CONDUCTIVE PATTERNS AND METHOD THEREFOR", now U.S. Pat. No. 6,930,256, issued Aug. 16, 2005, all of which are herein incorporated by reference in their entirety.

BACKGROUND OF THE INVENTION

Field of the Invention

The present invention relates generally to semiconductor packaging, and more specifically, to a semiconductor package having blind vias for interconnecting a metal layer atop the semiconductor package to internal circuits of the semiconductor package.

Description of the Related Art

Semiconductor packages that provide mechanical mounting and electrical interconnection of a semiconductor die are commonly provided in ball grid array and land grid array configurations. A semiconductor die is electrically connected to a substrate with a grid array terminals disposed on the "bottom" side of the semiconductor package and solder balls are attached for connection to a system substrate, typically a printed circuit board (PCB) having lands located to attach the solder balls of the semiconductor package (referred to as ball grid array or BGA attach). Alternatively, conductive paste, a socket or "interposer" may be used to provide contacts between lands of the semiconductor package and lands on the system substrate (referred to as land grid array or LGA connection).

The above-incorporated Parent U.S. Patent Application discloses a top-surface mounting terminal structure for attaching a second semiconductor package or die to the top of a first semiconductor package. While the packaging density of the combined devices is increased, the location of the terminals is dictated by the design of the die or semiconductor package mounted on the first semiconductor package, which typically increases the interconnect density of the substrate in the first semiconductor package.

Also, it is often desirable to provide a metal shield cap atop a semiconductor package. Such shields are usually connected to a ground terminal or other reference voltage level by a through via extending through the semiconductor package to one or more terminals.

Therefore, it would be desirable to improve upon the techniques of the above-incorporated parent U.S. Patent Application to provide a semiconductor package and a method of manufacturing such a semiconductor package that facilitates stacking of grid arrays and other components while reducing interconnect densities in the semiconductor package and increases flexibility of design. It would further be desirable to improve the techniques of the above-incorporated parent U.S. Patent Application to provide a semiconductor package and method of manufacture that provides a metal shield cap without requiring additional through vias.

SUMMARY OF THE INVENTION

In accordance with one embodiment, a method of manufacturing a semiconductor package includes mounting and electrically connecting a semiconductor die to a substrate. The semiconductor die and the substrate are encapsulated to form an encapsulation. Via holes are laser-ablated through the encapsulation and conductive material is deposited within the via holes to form vias.

A first buildup dielectric layer is formed on the encapsulation. Laser-ablated artifacts are laser-ablated in the first buildup dielectric layer. The laser-ablated artifacts in the first buildup dielectric layer are filled with a first metal layer to form a first electrically conductive pattern in the first buildup dielectric layer. The operations of forming a buildup dielectric layer, forming laser-ablated artifacts in the buildup dielectric layer, and filling the laser-ablated artifacts with an electrically conductive material to form an electrically conductive pattern can be performed any one of a number of times to achieve the desired redistribution.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 4:
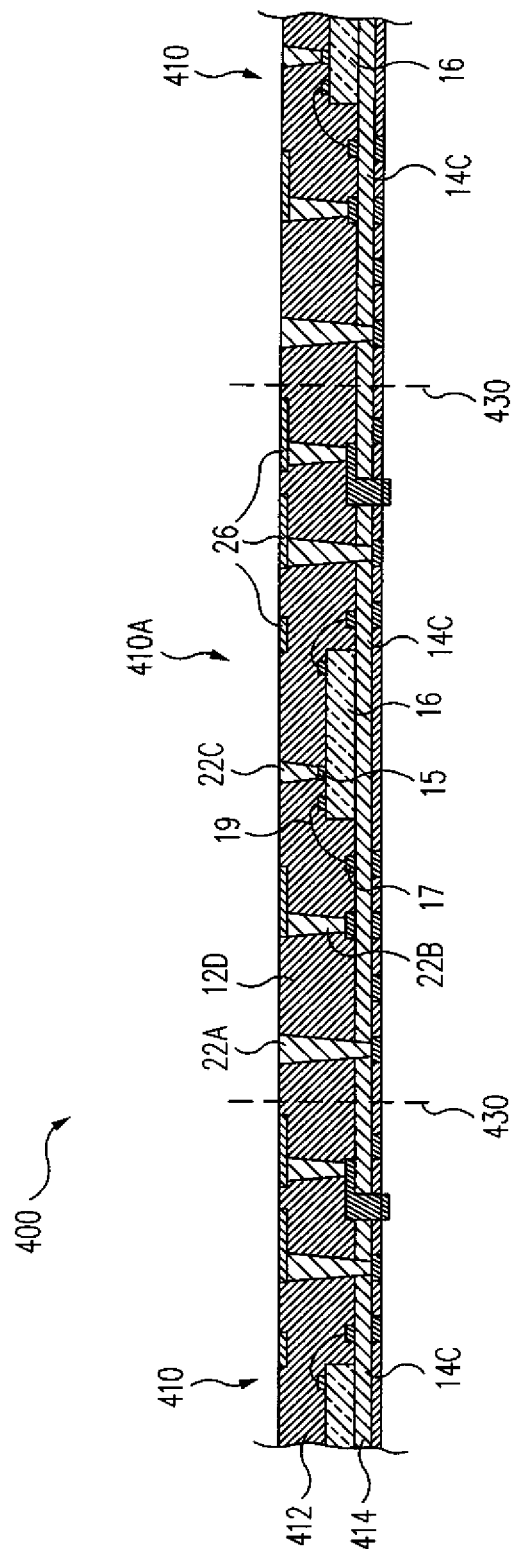
FIG. 4 is a pictorial diagram of an assembly 400 during the fabrication of a plurality of semiconductor packages in accordance with one embodiment of the present invention.

In accordance with one embodiment, referring to FIG. 4, a method of manufacturing a semiconductor package 410A includes mounting and electrically connecting a semiconductor die 16 to a substrate 14C. Semiconductor die 16 and substrate 14C are encapsulated in an assembly encapsulant 412 to form an encapsulation 12D, encapsulation 12D being a portion of assembly encapsulant 412.

Via holes are laser-ablated through encapsulation 12D and conductive material is deposited within via holes to form vias 22A, 22B, 22C.

Figure 5:
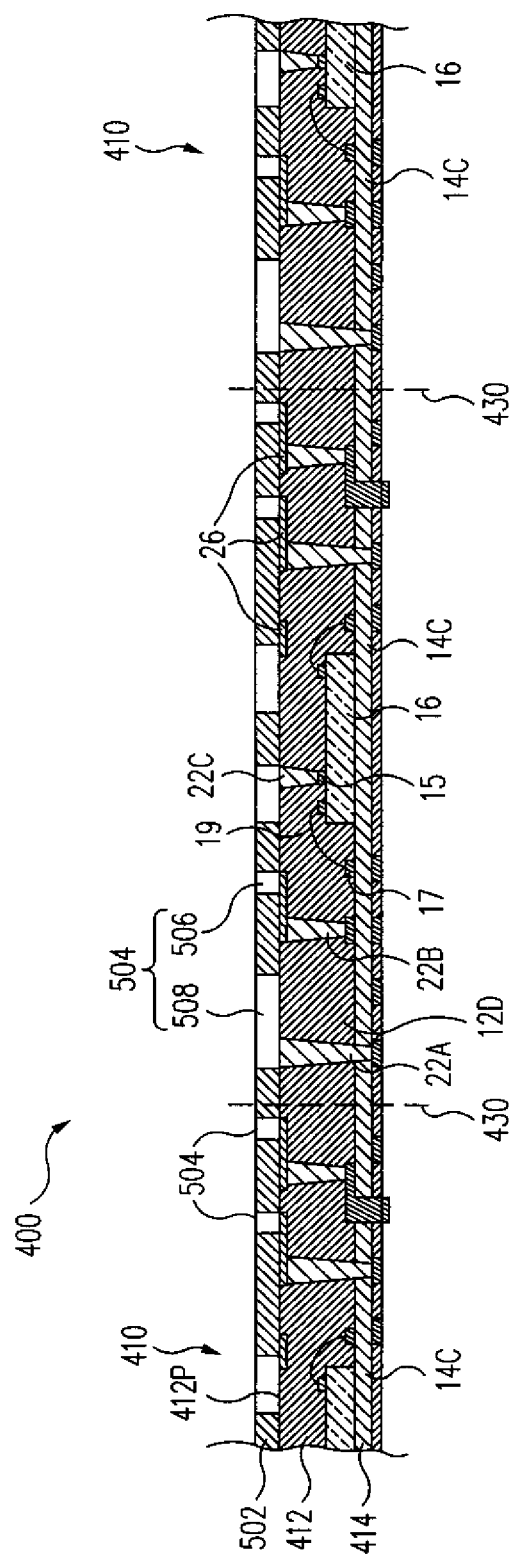
FIGS. 5, 6, 7, 8, and 9 are pictorial diagrams of the assembly of FIG. 4 at further stages of fabrication in accordance with various embodiments of the present invention.

Referring now to FIG. 5, a first buildup dielectric layer 502 is formed on encapsulation 12D. Laser-ablated artifacts 504 are laser-ablated in first buildup dielectric layer 502.

Figure 6:
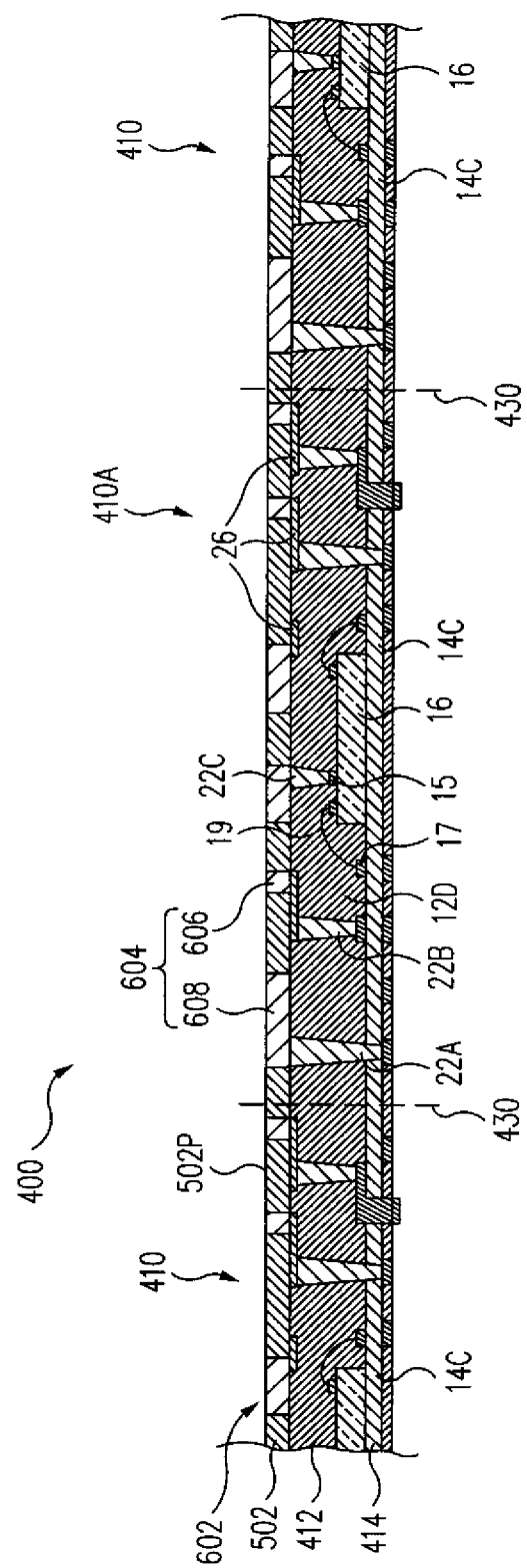
Figure 7:
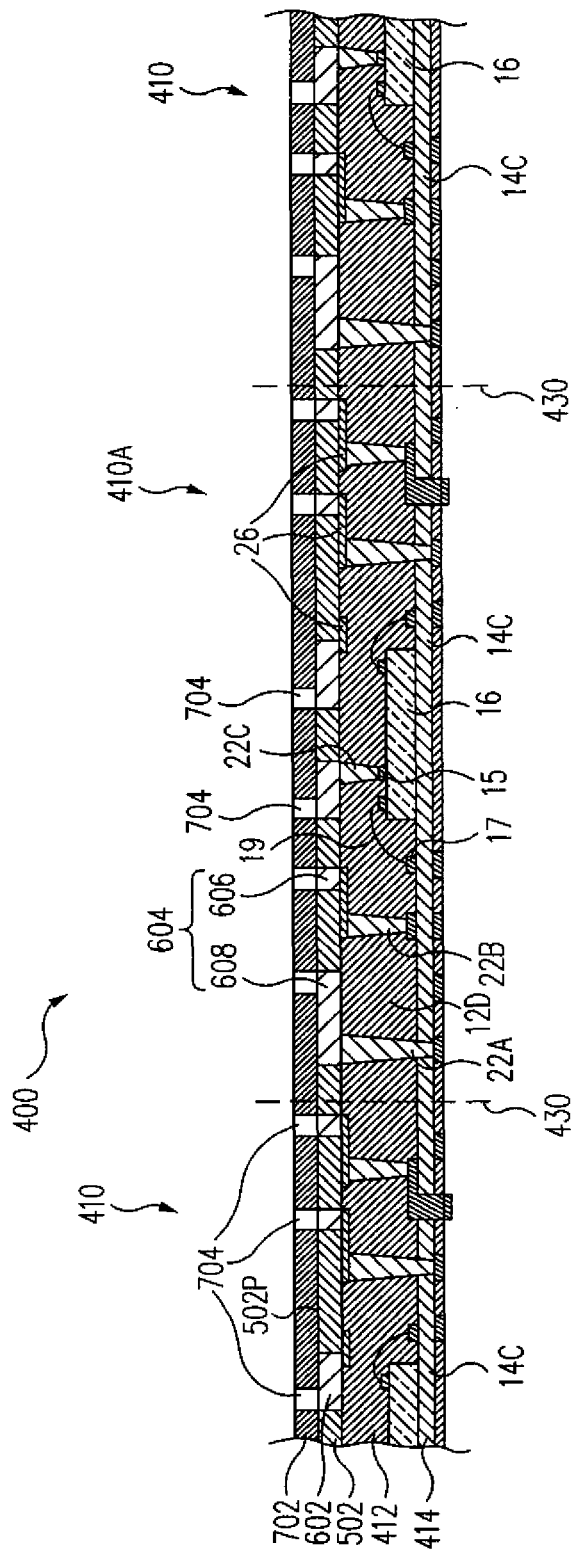
Figure 8:
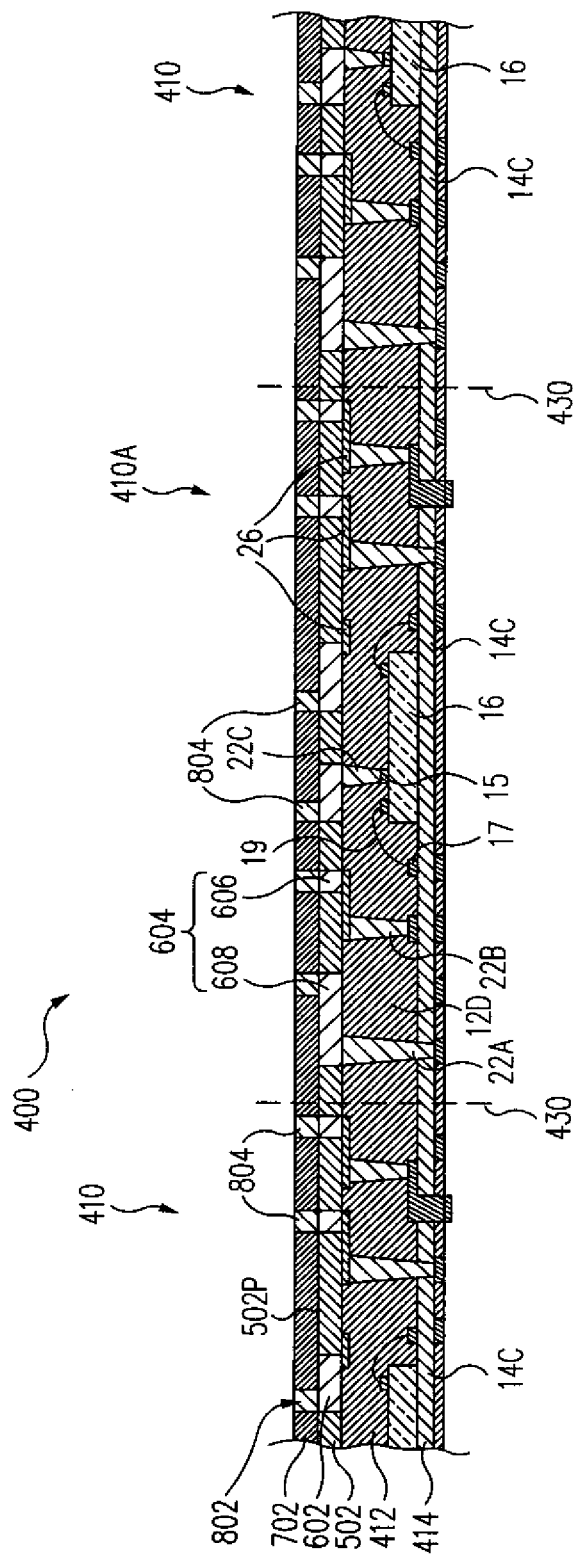

Referring now to FIGS. 5 and 6 together, laser-ablated artifacts 504 in first buildup dielectric layer 502 are filled with a first metal layer 602 to form a first electrically conductive pattern 604 in first buildup dielectric layer 502. As shown in FIGS. 7 and 8, the operations of forming a buildup dielectric layer, forming laser-ablated artifacts in the buildup dielectric layer, and filling the laser-ablated artifacts with an electrically conductive material to form an electrically conductive pattern can be performed any one of a number of times to achieve the desired redistribution.

More particularly, in accordance with the present invention, a semiconductor package and a method for manufacturing a semiconductor package that include a metal layer formed atop a semiconductor package encapsulation and connected to an internal substrate of the semiconductor package by blind vias and/or terminals on the bottom side of the encapsulation by through vias is presented.

While the exemplary embodiments depict ball grid array packages, it will be understood by those skilled in the art, that the techniques in accordance with the present invention can be extended to other types of semiconductor packages. The exemplary embodiments also show wirebond die connections within the semiconductor package, but it will be understood that any type of internal die and die mounting can be used within the semiconductor package embodiments of the present invention.

Figure 1A:
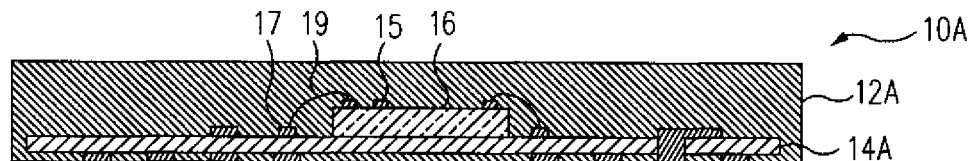
FIGS. 1A-1H are pictorial diagrams depicting stages in preparation of a semiconductor package in accordance with an embodiment of the present invention.

Referring now to FIG. 1A, a semiconductor package 10A for forming a semiconductor package in accordance with an embodiment of the invention and corresponding to a first illustrated step of manufacture is depicted. Semiconductor package 10A is in the form of a ball grid array (BGA) or land grid array (LGA) package as is commonly known in the art, except that particular circuit features are positioned for providing vias to the top side of semiconductor package 10A in subsequent manufacturing steps, so that connections may be made to features to be formed in subsequent steps.

Semiconductor package 10A includes a die 16 mounted to a substrate 14A that includes lands 18 to which solder ball terminals may be attached or that may be connected with a conductive paste to form a LGA mounted semiconductor package. Encapsulation 12A surrounds die 16 and substrate 14A, although substrate 14A may alternatively be exposed on a bottom side of semiconductor package 10A. Electrical connections 15, sometimes called bond pads, of die 16 are connected to circuit patterns 17 on substrate 14A via wires 19, but the type of die mounting is not limiting, but exemplary and other die mounting types may be used such as flip-chip die mounting. Additionally, while substrate 14A is depicted as a film or laminate-type mounting structure, lead frame and other substrate technologies may be used within the structures of the present invention.

Figure 1B:
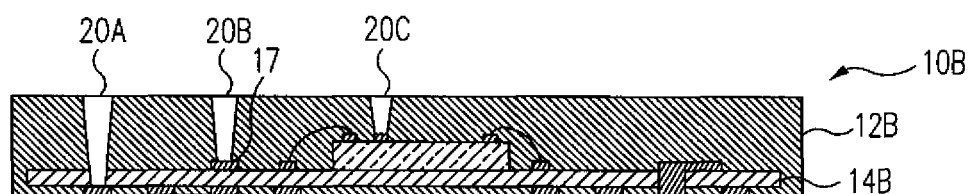

Referring now to FIG. 1B, a first modification to semiconductor package 10A that illustrates a second step in the manufacturing process to form semiconductor package 10B is shown. Semiconductor package 10B includes a plurality of via holes 20A, 20B and 20C laser-ablated through encapsulation 12A of FIG. 1A to form encapsulation 12B and substrate 14B. While only three via holes are shown, many via holes may be provided. The three via holes shown and as disclosed in the above-incorporated parent U.S. Patent Application illustrate the three different types of via holes that may be provided through control of laser energy and exposure time. The first via hole type, illustrated as via 20A, is fabricated by laser-ablating either completely through semiconductor package 10B or by laser-ablating through encapsulation 12A to the top side of lands 18, so that a connection is provided from the top side of semiconductor package 10B to the bottom side of semiconductor package 10B when the via is filled. If via 20A is ablated completely through, then the corresponding land 18 is provided by the bottom surface of a via formed in hole 20A.

The next type of via hole is provided by laser-ablating through encapsulation 12A to reach circuit pattern 17 so that connection may be made through substrate 14A circuit patterns to die 16 electrical terminals, to lands 18 or both. The last type of via is provided by laser-ablating through encapsulation 12A to reach electrical connections 15 of die 16 so that direct connection to the circuits of die 16 can be made from a piggybacked semiconductor package. Each of via holes 20A, 20B and 20C is depicted as a via hole having a conical cross-section, which is desirable for providing uniform plating current density during a plating process. However, via holes 20A, 20B and 20C may alternatively be made cylindrical in shape if the advantage of cylindrical cross-section is not needed, for example if a conductive paste is used to fill the via holes.

Figure 1C:
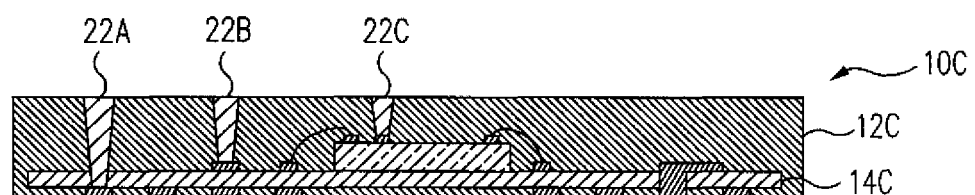

Referring now to FIG. 1C, a semiconductor package step 10C is illustrated. Conductive material applied within via holes 20A, 20B and 20C to form conductive vias 22A, 22B and 22C through encapsulation 12C and optionally substrate 14C for vias that are formed completely through substrate 14C. The conductive material used to form vias 22A, 22B and 22C may be electroplated or electro-less plated metal, conductive paste such as copper or silver epoxy compounds, or a low melting temperature high-wicking solder alloy such as SUPER SOLDER.

Figure 1D:
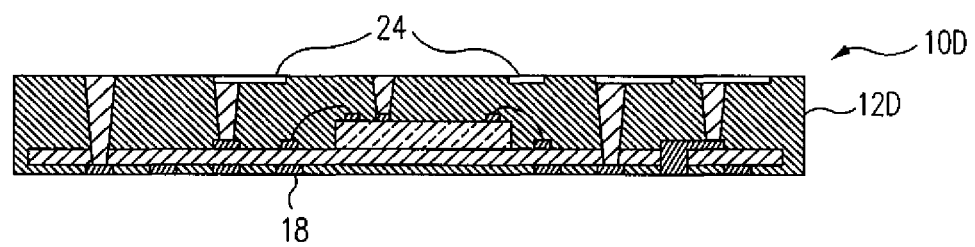

Referring now to FIG. 1D, a next step of preparation of a semiconductor package 10D is illustrated. Channels 24 are laser-ablated in the top surface of encapsulation 12C to form encapsulation 12D. Channels 24 may define circuit traces, terminals and other features that either provide complete interconnection at the top surface of encapsulation 12D or connect top-side features such as circuit traces and terminals to one or more of vias 22A, 22B and 22C.

Figure 1E:
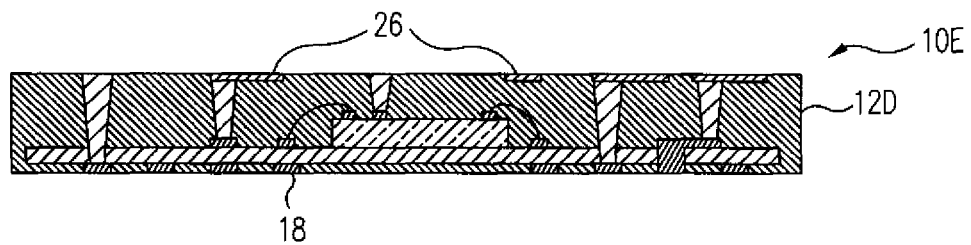

Next, as shown in FIG. 1E, channels 24 are filled to provide a metal layer 26 in a semiconductor package step 10E. Channels 24 may be filled by electroplating, filling with conductive paste with planarization if required, or electro-less plating after treating channels 24 with an activating compound. Further, the top surface of encapsulation 12D may be overplated or over-pasted and then etched to isolate the circuit features of metal layer 26.

Figure 1F:
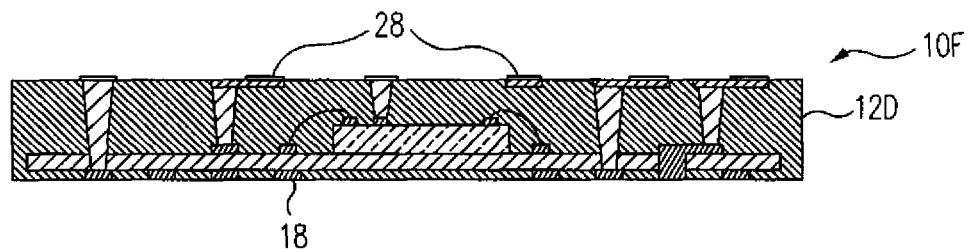

After formation of metal layer 26, plating 28 may be applied as shown in FIG. 1F, yielding semiconductor package step 10F to protect the surface of metal layer and/or to prepare terminal areas defined by the top surface of metal layer 26 for further processing such as wire bond attach or soldering.

Figure 1G:
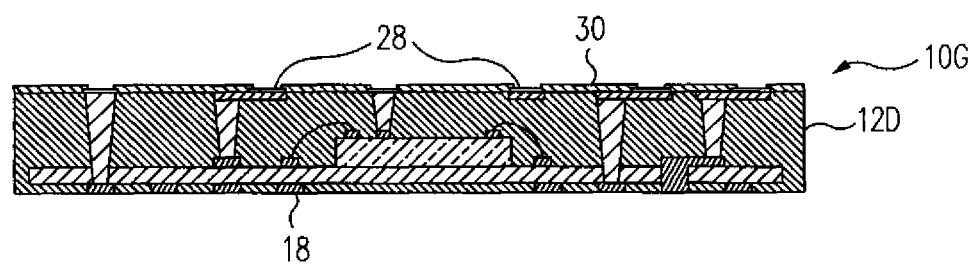

Then, as shown in FIG. 1G, a solder mask 30 may be applied over the top of encapsulation 12D and portions of the metal layer 26, yielding semiconductor package step 10G. Solder mask 30 is useful in operations where reflow solder operations will be used to attach components to metal layer 26.

Solder balls 34 may be attached to bottom-side terminals 18 of semiconductor package step 10G to yield a completed ball-grid-array (BGA) package 10H that is ready for mounting on a circuit board or other mounting location. Alternatively, as with all depicted final semiconductor packages described herein below, the step illustrated in FIG. 1H may be omitted and bottom side terminals 18 plated, yielding a land-grid-array (LGA) package.

Figure 2A:
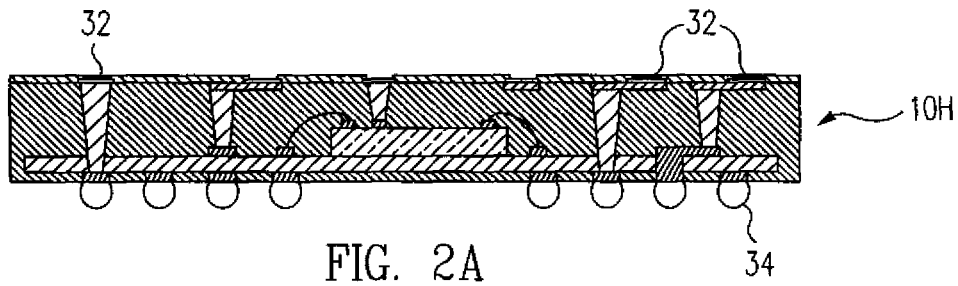
FIGS. 2A-2C are pictorial diagrams depicting further stages in assembly of a semiconductor package in accordance with another embodiment of the present invention.

A "tinning" coat of solder 32 may be applied to the top side of semiconductor package 10H as illustrated by FIG. 2A to prepare for mounting of top side components. The solder may be selectively applied to only solder mounting terminal areas via a mask.

Figure 1H:
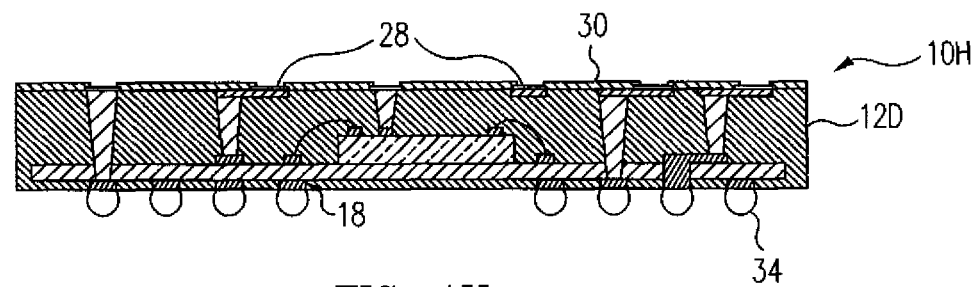
Figure 2B:
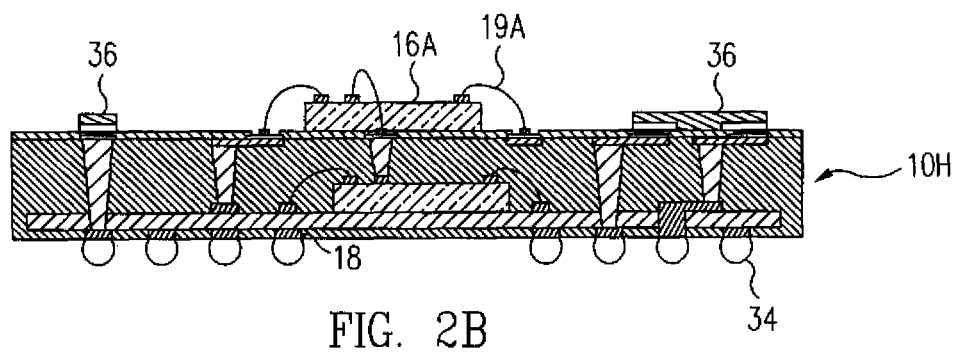

Next, components are mounted on the top side of semiconductor package 10H and attached to metal layer 26 as illustrated in FIG. 2B. It will be apparent that the steps of attaching solder balls depicted in FIG. 1H can be performed after this step and that in general, various steps in formation of structures above encapsulation 12D may be performed at different times. FIG. 2B illustrates mounting of another semiconductor die 16A that is wire-bonded via wires 19A to plated terminals of metal layer 26 and also mounting of discrete surface-mount components 36 via reflow soldering.

Figure 2C:
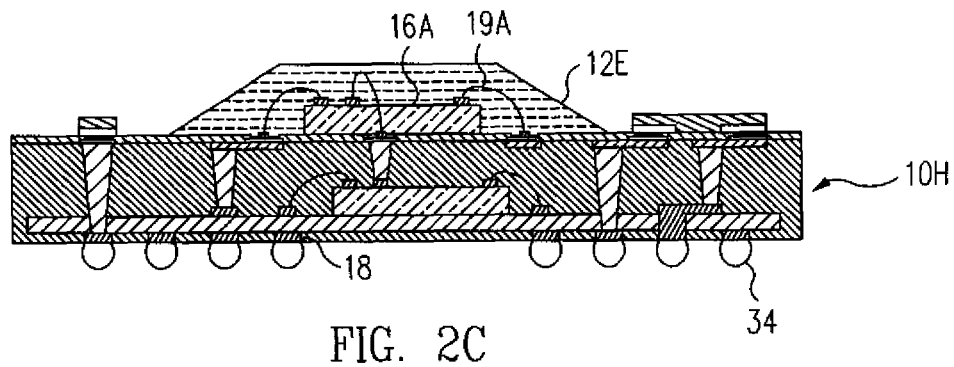

After attachment and interconnection of die 16A, as shown in FIG. 2C, a second encapsulation 12E may be applied over die 16A, wires 19A and part of the top surface, sometimes called principal surface, of encapsulation 12D to form a completed assembly.

Figure 2D:
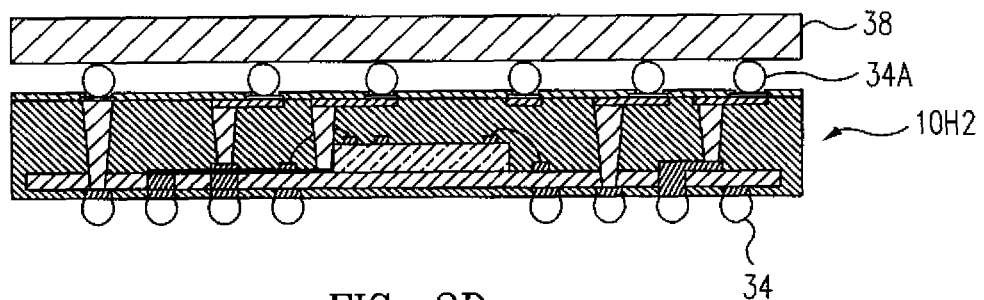
FIG. 2D is a pictorial diagram depicting a semiconductor package in accordance with another embodiment.

Another alternative embodiment of the present invention is shown in FIG. 2D. In FIG. 2D, another semiconductor package 38 may be ball-mounted to terminals formed on metal layer 26. The depicted embodiment provides for redistribution of terminals at virtually any position atop semiconductor package 10H2, since metal layer 26 can provide routing of circuits from vias such as 22A-C to solder balls 34A at virtually any position atop semiconductor package 10H2.

Figure 3A:
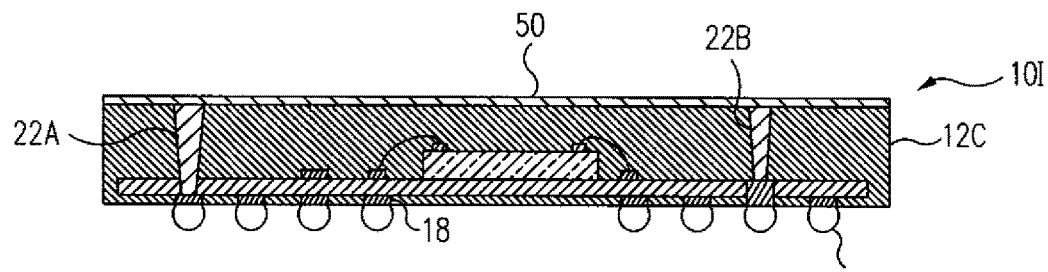
FIG. 3A is a pictorial diagram depicting a semiconductor package in accordance with another embodiment of the present invention.

FIG. 3A illustrates another embodiment of the present invention that includes a metal layer 50 that provides a shield cap for semiconductor package 10I. Metal layer 50 may be electro-less plated atop encapsulation 12C (See FIGS. 1A-1C for formation steps prior to FIG. 3A) by applying a seed layer or may be paste screened to form metal layer 50. Metal layer 50 may be solid layer, or a continuous pattern such as a mesh screen to reduce separation and required metal to improve the plating process. Metal layer 50 is electrically connected to vias 22A and/or 22B to provide a return path for the shield.

Figure 3B:
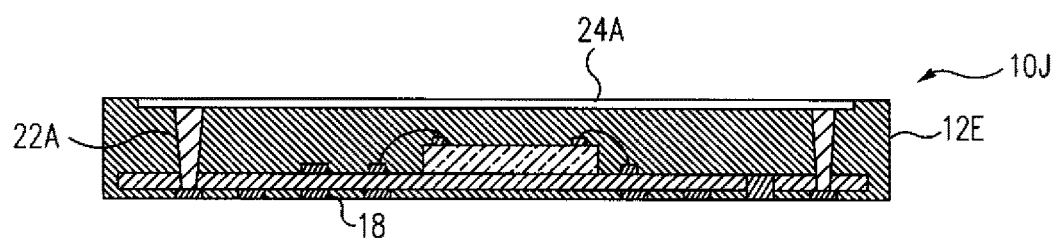
FIGS. 3B-3C are pictorial diagrams depicting stages in fabrication of a semiconductor package in accordance with yet another embodiment of the present invention.
Figure 3C:
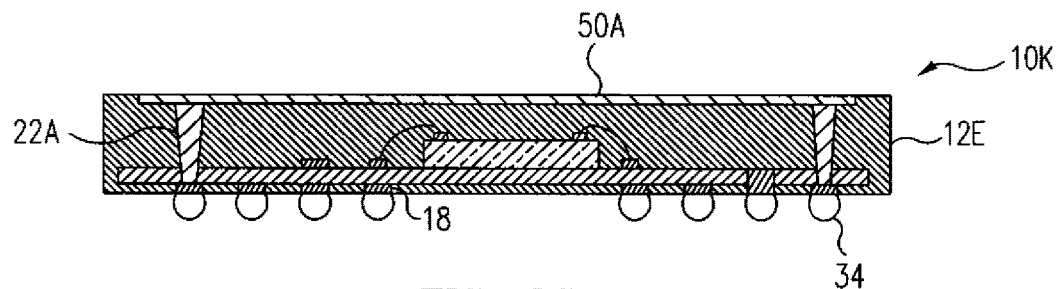

FIG. 3B illustrates another shield embodiment of the present invention. A shield cavity is laser-ablated in the top surface of encapsulation 12E to form a semiconductor package step 10J having a cavity 24A. Cavity 24A is then filled to form a metal shield layer 50A as shown in FIG. 3C. Metal layer 50A may be applied by paste screening or plating (and possible subsequent etching process) to yield a shield that is contained within the sides of semiconductor package 10K.

FIG. 4 is a pictorial diagram of an assembly 400 during the fabrication of a plurality of semiconductor packages 410 in accordance with one embodiment of the present invention. Referring now to FIGS. 1E and 4 together, assembly 400 of FIG. 4 includes a plurality of semiconductor packages 410 integrally connected together. Each semiconductor package 410 of assembly 400 is substantially identical to semiconductor package 10E of FIG. 1E, and semiconductor packages 410 are simply relabeled for clarity of discussion. Only the significant differences between assembly 400 and semiconductor package 10E are discussed below.

Illustratively, assembly 400 includes an assembly substrate 414 comprising a plurality of substrates 14C integrally connected together. Substrates 14C are substantially similar to substrate 14C illustrated in FIG. 1C.

Further, assembly 400 includes an assembly encapsulant 412, e.g., a single integral layer of encapsulant encapsulating assembly substrate 414, corresponding to a plurality of the encapsulations 12D illustrated in FIG. 1E. Assembly 400 of FIG. 4 is fabricated in a manner similar to that discussed above with regards to semiconductor package 10E of FIG. 1E, the discussion of which is herein incorporated by reference.

Referring now to FIG. 4, assembly 400 includes a plurality of semiconductor packages 410 as set forth above. Illustratively, semiconductor packages 410 are delineated from one another by singulation streets 430. Semiconductor packages 410 include a first semiconductor package 410A, which is representative of all of the semiconductor packages 410.

FIG. 5 is a pictorial diagram of assembly 400 at a further stage of fabrication in accordance with one embodiment of the present invention. Referring now to FIG. 5, a first assembly buildup dielectric layer 502 is formed on the principal surface 412P of assembly encapsulant 412.

Buildup dielectric layer 502 is an electrically insulating material. Illustratively, buildup dielectric layer 502 is epoxy molding compound (EMC) molded on principal surface 412P of assembly encapsulant 412. In another example, buildup dielectric layer 502 is a liquid encapsulant that has been cured. In yet another example, buildup dielectric layer 502 is a single sided adhesive dielectric layer which is adhered on principal surface 412P of assembly encapsulant 412. Although various examples of buildup dielectric layer 502 are set forth, the examples are not limiting, and it is to be understood that other dielectric materials can be used to form buildup dielectric layer 502.

Laser-ablated artifacts 504, e.g., openings, are formed in buildup dielectric layer 502 using laser ablation in one embodiment. Illustratively, laser-ablated artifacts 504 include via holes 506 and channels 508. Laser-ablated artifacts 504 extend through buildup dielectric layer 502 and expose portions of metal layer 26.

FIG. 6 is a pictorial diagram of assembly 400 at a further stage of fabrication in accordance with one embodiment of the present invention. Referring now to FIGS. 5 and 6 together, a metal layer 602 is formed and fills laser-ablated artifacts 504. More generally, laser-ablated artifacts 504 are filled with metal layer 602, e.g., an electrically conductive material such as copper. Illustratively, copper is plated and reduced to fill laser-ablated artifacts 504.

Filling laser-ablated artifacts 504 creates an electrically conductive pattern 604 within first buildup dielectric layer 502. Illustratively, via holes 506 and channels 508 (FIG. 5) are filled with metal layer 602 to form electrically conductive vias 606 and traces 608, respectively, within first buildup dielectric layer 502.

Vias 606 and traces 608 are electrically connected to the pattern of metal layer 26. In one example, vias 606 are vertical conductors extending through buildup dielectric layer 502 in a direction substantially perpendicular to the plane formed by a principal surface 502P of buildup dielectric layer 502. Traces 608 are horizontal conductors extending parallel to the plane formed by a principal surface 502P of buildup dielectric layer 502. Traces 608 extend entirely through buildup dielectric layer 502 as shown in FIG. 6. However, in another embodiment, traces 608 are formed in buildup dielectric layer 502 at principal surface 502P and a portion of buildup dielectric layer 502 remains between traces 608 and assembly encapsulant 412. Although vias 606 and traces 608 are set forth, in light of this disclosure, those of skill in the art will understand that other electrically conductive structures can be formed in electrically conductive pattern 604. Illustratively, solder ball pads or SMT pads are formed in electrically conductive pattern 604.

Further, it is understood that the operations of forming a buildup dielectric layer, forming laser-ablated artifacts in the buildup dielectric layer, and filling the laser-ablated artifacts with an electrically conductive material to form an electrically conductive pattern can be performed any one of a number of times to achieve the desired redistribution. Such an example is set forth below in reference to FIGS. 7 and 8.

FIG. 7 is a pictorial diagram of assembly 400 at a further stage of fabrication in accordance with one embodiment of the present invention. Referring now to FIG. 7, a second buildup dielectric layer 702 is formed on principal surface 502P of first buildup dielectric layer 502.

Buildup dielectric layer 702 is an electrically insulating material. In one embodiment, buildup dielectric layer 702 is formed of the same material and in a similar manner as buildup dielectric layer 502, and so formation of buildup dielectric layer 702 is not discussed in detail.

Laser-ablated artifacts 704, e.g., openings, are formed in buildup dielectric layer 702 using laser ablation in one embodiment. Illustratively, laser-ablated artifacts 704 include via holes, channels, solder ball pad openings and/or SMT pad openings. Laser-ablated artifacts 704 extend through buildup dielectric layer 702 and expose portions of metal layer 602.

FIG. 8 is a pictorial diagram of assembly 400 at a further stage of fabrication in accordance with one embodiment of the present invention. Referring now to FIGS. 7 and 8 together, a metal layer 802 is formed and fills laser-ablated artifacts 704. More generally, laser-ablated artifacts 704 are filled with metal layer 802, e.g., an electrically conductive material 802 such as copper. Illustratively, copper is plated and reduced to fill laser-ablated artifacts 704.

Filling laser-ablated artifacts 704 creates an electrically conductive pattern 804. Illustratively, electrically conductive pattern 804 includes electrically conductive vias, traces, solder ball pads, and/or SMT pads. Electrically conductive pattern 804 is electrically connected to electrically conductive pattern 604 through buildup dielectric layer 702.

Figure 9:
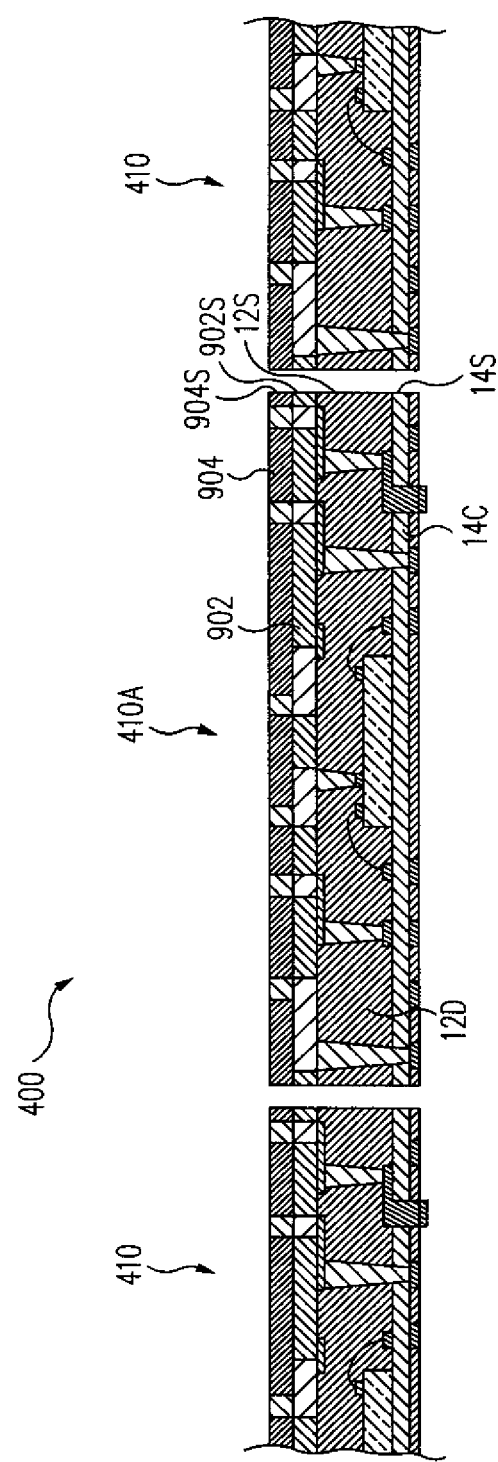

FIG. 9 is a pictorial diagram of assembly 400 at a further stage of fabrication in accordance with one embodiment of the present invention. Referring now to FIGS. 8 and 9 together, assembly 400 is singulated along singulation streets 430 thus forming a plurality of individual semiconductor packages 410 as shown in FIG. 9. Each semiconductor packages 410 includes an encapsulation 12D, a substrate 14C, a first buildup dielectric layer 902, and a second buildup dielectric layer 904. Encapsulation 12D is a portion of assembly encapsulant 412. Substrate 14C is a portion of assembly substrate 414. First buildup dielectric layer 902 is a portion of assembly buildup dielectric layer 502. Finally, second buildup dielectric layer 904 is a portion of assembly buildup dielectric layer 702.

As shown in FIG. 9, for each semiconductor package 410, sides 14S, 12S, 902S, 904S of substrate 14C, encapsulation 12D, first buildup dielectric layer 902, second buildup layer 904, respectively, are flush with one another, i.e., are substantially coplanar and in the same plane.

Although the formation of a plurality of individual semiconductor packages 410 using assembly 400 is set forth above, in light of this disclosure, those of skill the art will understand that semiconductor packages 410 can be formed individually, if desired.

Figure 10:
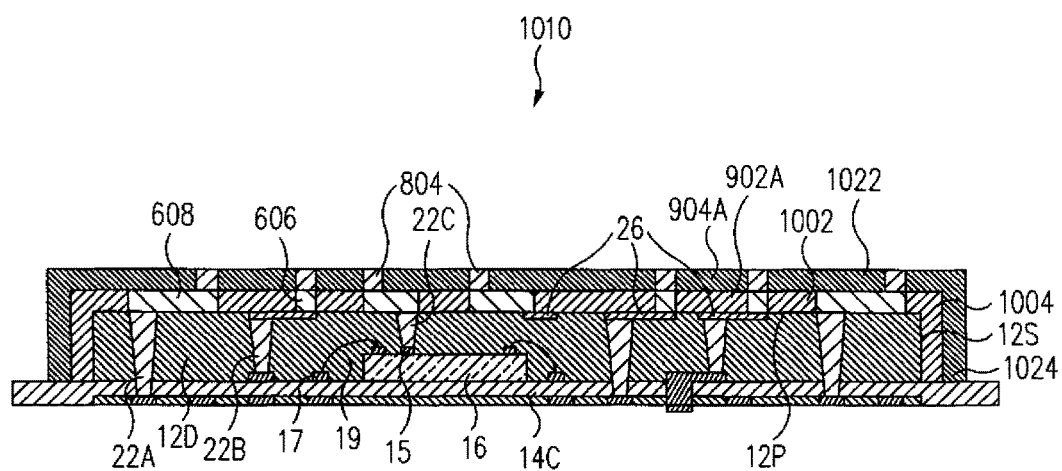
FIG. 10 is a pictorial diagram of a semiconductor package in accordance with another embodiment of the present invention.

FIG. 10 is a pictorial diagram of a semiconductor package 1010 in accordance with another embodiment of the present invention. Semiconductor package 1010 of FIG. 10 is similar to semiconductor package 410A of FIG. 9 and only the significant differences are discussed below.

Semiconductor package 1010 includes a first buildup dielectric layer 902A and a second buildup dielectric layer 904A. First buildup dielectric layer 902A and second buildup dielectric layer 904A of semiconductor package 1010 of FIG. 10 are similar to first buildup dielectric layer 902 and second buildup dielectric layer 904 of semiconductor package 410 of FIG. 9, respectively. Only the significant differences between buildup dielectric layers 902A, 904A and buildup dielectric layers 902, 904 are discussed below.

Referring now to FIG. 10, first buildup dielectric layer 902A entirely encloses encapsulation 12D. More particularly, first buildup dielectric layer 902A forms a cap that entirely encloses encapsulation 12D. First buildup dielectric layer 902A is formed on and directly contacts the principal surface 12P and sides 12S of encapsulation 12D. Further, first buildup dielectric layer 902A contacts the upper surface of substrate 14C directly adjacent encapsulation 12D.

First buildup dielectric layer 902A includes a horizontal portion 1002 and sidewalls 1004. Horizontal portion 1002 contacts principal surface 12P of encapsulation 12D. Sidewalls 1004 extend perpendicularly from horizontal portion 1002 to substrate 14C and contact sides 12S of encapsulation 12D.

Similarly, second buildup dielectric layer 904A entirely encloses first buildup dielectric layer 902A. More particularly, second buildup dielectric layer 904A forms a cap that entirely encloses first buildup dielectric layer 902A. Second buildup dielectric layer 904A is formed on and directly contacts the horizontal portion 1002 and sidewalls 1004 of first buildup dielectric layer 902A. Further, second buildup dielectric layer 904A contacts the upper surface of substrate 14C directly adjacent first buildup dielectric layer 902A.

Second buildup dielectric layer 904A includes a horizontal portion 1022 and sidewalls 1024. Horizontal portion 1022 contacts horizontal portion 1002 of first buildup dielectric layer 902A. Sidewalls 1024 extend perpendicularly from horizontal portion 1022 to substrate 14C and contact sidewalls 1004 of first buildup dielectric layer 902A.

Semiconductor packages 410, 1010 (FIGS. 9, 10) can be further processed. Illustratively, plating and solder masks similar to plating 28 of FIG. 1F and solder mask 30 of FIG. 1G are formed. Solder balls are attached to bottom-side terminals 18 to yield a completed ball-grid-array (BGA) package that is ready for mounting on a circuit board or other mounting location. Formation of solder balls is similar to formation of solder balls 34 as illustrated in FIG. 1H and discussed above and so is not repeated here. Alternatively, solder balls are not formed, yielding a land-grid-array (LGA) package.

A "tinning" coat of solder may be applied to the metal layer 802 to prepare for mounting of top side components. The solder is similar to solder 32 as illustrated in FIG. 2A and discussed above and so is not repeated here. The solder may be selectively applied to only solder mounting terminal areas via a mask.

Next, components are mounted on the top surface of semiconductor package 410, 1010 and attached to metal layer 802 in a manner similar to that illustrated in FIGS. 2C, 2D, and so is not repeated here. By forming electrically conductive patterns in successive buildup dielectric layers, the pattern of vias 22A, 22B, 22C is redistributed into the desired footprint (layout) of the top most electrically conductive pattern, e.g., electrically conductive pattern 804. Specifically, the footprint of electrically conductive pattern 804 is optimized for attachment of component(s) on the top surface of semiconductor packages 410, 1010. Conversely, the pattern of vias 22A, 22B, 22C is largely dictated by the layout of lands 18, circuit pattern 17 and electrical conductors 15.

The drawings and the forgoing description give examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. An integrated circuit package comprising:
   a substrate comprising a first substrate side, a second substrate side opposite the first substrate side, and a plurality of lateral substrate sides that extend between the first substrate side and the second substrate side;
   an integrated circuit die comprising a first die surface, a second die surface opposite the first die surface, and a plurality of lateral die surfaces that extend between the first die surface and the second die surface, where the second die surface is coupled to the first substrate side; and
   an encapsulant that covers at least the plurality of lateral die surfaces and the plurality of lateral substrate sides,
   wherein the substrate comprises a plurality of conductive layers comprising:
      a first conductive layer comprising a plurality of conductive interconnects at the first substrate side, wherein:
         each of the conductive interconnects is coupled to a respective pad of the integrated circuit die;
         each of the conductive interconnects comprises a metal positioned outside a footprint of the integrated circuit die; and
         each of the conductive interconnects comprises a laterally outermost surface that is positioned laterally inward from an outermost periphery of the substrate; and
      a second conductive layer comprising a plurality of lands at the second substrate side.

2. The integrated circuit package of claim 1, wherein the encapsulant contacts and covers the entire first die surface and at least a portion of the first substrate side.

3. The integrated circuit package of claim 1, wherein:
   the lands are exposed from the encapsulant;
   the entire lands are laterally surrounded by the encapsulant; and
   the encapsulant does not extend lower than the lands.

4. The integrated circuit package of claim 1, wherein the encapsulant comprises planar side surfaces that extend vertically downward from an upper level above the first die surface to a lower level at least as low as a lowest surface of the substrate.

5. The integrated circuit package of claim 1, wherein:
   the substrate comprises a laminate substrate; and
   the encapsulant comprises a first horizontal surface that is generally as low as a lowest part of the substrate.

6. The integrated circuit package of claim 1, wherein said each of the conductive interconnects is wirebonded to its respective pad of the integrated circuit die.

7. The integrated circuit package of claim 1, wherein:
   each of the conductive interconnects comprises a first interconnect surface that faces away from the first substrate side;
   a first portion of the first interconnect surface is covered by an electrical connection from the first interconnect surface to the die; and
   an entirety of the first interconnect surface other than the first portion is covered by the encapsulant.

8. The integrated circuit package of claim 1, wherein the substrate comprises a dielectric layer positioned vertically between the first and second conductive layers.

9. The integrated circuit package of claim 1, wherein the substrate is a laminate substrate or a film substrate.

10. The integrated circuit package of claim 1, wherein the substrate comprises a dielectric layer and tapered conductive vias extending through the dielectric layer.

11. The integrated circuit package of claim 1, wherein the encapsulant comprises:
    a first encapsulant side facing away from the substrate;
    a second encapsulant side opposite the first encapsulant side; and
    a plurality of lateral encapsulant sides that extend between the first encapsulant side and the second encapsulant side,
    wherein a portion of the second encapsulant side around a perimeter of the substrate is exposed at an exterior of the integrated circuit package.

12. An integrated circuit package, comprising:
    a substrate comprising a first substrate side, a second substrate side opposite the first substrate side, and a plurality of lateral substrate sides that extend between the first and second substrate sides, wherein the substrate comprises:
       a substrate structure comprising a dielectric layer;
       a circuit pattern at the first substrate side;
       a land at the second substrate side; and
       a conductive via extending through the dielectric layer and electrically connecting the circuit pattern and the land;
    a die mounted to the first substrate side and connected to the circuit pattern; and
    an encapsulant that encapsulates the die on the first substrate side and laterally surrounds the entire lateral substrate sides, wherein the encapsulant comprises a second encapsulant surface that faces the first substrate side and a first encapsulant surface opposite the second encapsulant surface, wherein:
- the circuit pattern comprises a metal that is positioned outside a footprint of the die;
- the circuit pattern comprises a first pattern surface that faces away from the first substrate side;
- a first portion of the first pattern surface is covered by an electrical connection from the first pattern surface to the die; and
- an entirety of the first pattern surface other than the first portion is covered by the encapsulant.

13. The integrated circuit package of claim 12, further comprising a conductive ball attached to the land.

14. The integrated circuit package of claim 12, wherein the circuit pattern comprises a laterally outermost surface that is positioned laterally inward from a laterally outermost part the lateral substrate sides.

15. The integrated circuit package of claim 12, wherein the die is wirebonded to the substrate.

16. The integrated circuit package of claim 12, wherein the substrate is a laminate substrate.

17. The integrated circuit package of claim 12, wherein the land is exposed from the encapsulant.

18. The integrated circuit package of claim 12, wherein the encapsulant that laterally surrounds the lateral substrate sides remains from singulation of the integrated circuit package from an assembly comprising a plurality of the integrated circuit packages.

19. An integrated circuit package comprising:
- a substrate comprising a first substrate side, a second substrate side opposite the first substrate side, and a plurality of lateral substrate sides that extend between the first substrate side and the second substrate side, wherein the substrate comprises:
  - a circuit pattern at the first substrate side; and
  - a land at the second substrate side;
- an integrated circuit die comprising a first die surface, a second die surface opposite the first die surface, and a plurality of lateral die surfaces that extend between the first die surface and the second die surface, where the second die surface is coupled to the first substrate side; and
- an encapsulant comprising a first encapsulant surface, a second encapsulant surface opposite the first encapsulant surface, and a plurality of encapsulant side surfaces that extend between the first encapsulant surface and the second encapsulant surface, where the second encapsulant surface is at substantially the same vertical level as the land at the second substrate side, and the land at the second substrate side is exposed from the encapsulant.

20. The integrated circuit package of claim 19, wherein the entire land is laterally surrounded by the encapsulant.

\* \* \* \* \*